United States Patent
Kawasumi

(10) Patent No.: US 6,466,486 B2
(45) Date of Patent: Oct. 15, 2002

(54) BUFFER CIRCUIT, AND SEMICONDUCTOR DEVICE AND SEMICONDUCTOR MEMORY DEVICE INCLUDING SAME

(75) Inventor: Atsushi Kawasumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/803,626

(22) Filed: Mar. 9, 2001

(65) Prior Publication Data

US 2001/0021119 A1 Sep. 13, 2001

(30) Foreign Application Priority Data

Mar. 9, 2000 (JP) ........................................ 2000-065409

(51) Int. Cl.[7] ............................................... G11C 7/00
(52) U.S. Cl. ............................ 365/189.05; 365/230.06; 365/230.08
(58) Field of Search ....................... 365/189.05, 230.06, 365/230.08

(56) References Cited

U.S. PATENT DOCUMENTS 6,172,918 B1 * 1/2001 Hidaka .................. 365/189.05

FOREIGN PATENT DOCUMENTS

JP 03-171849 7/1991
JP 08-162611 6/1996

* cited by examiner

Primary Examiner—Huan Hoang
(74) Attorney, Agent, or Firm—Hogan & Hartson, LLP

(57) ABSTRACT

A buffer circuit has an input terminal to receive input data, an output terminal to output a driving signal based on the input data to an output signal line connected to a plurality of gate circuits arranged in line and a driving amplitude changing circuit to change an amplitude of the driving signal in response to a signal to designate a specific gate circuit of the gate circuits. A semiconductor device has a first buffer circuit having the same construction of the buffer circuit, a decoder circuit for decoding an address of the plurality of gate circuits to output a decoded signal and a signal for changing a driving amplitude to the first buffer circuit and a second buffer circuit configured to supply the driving signal with changed amplitude from the first buffer circuit to the specific gate circuit in response to the decoded signal from the decoder circuit.

26 Claims, 9 Drawing Sheets

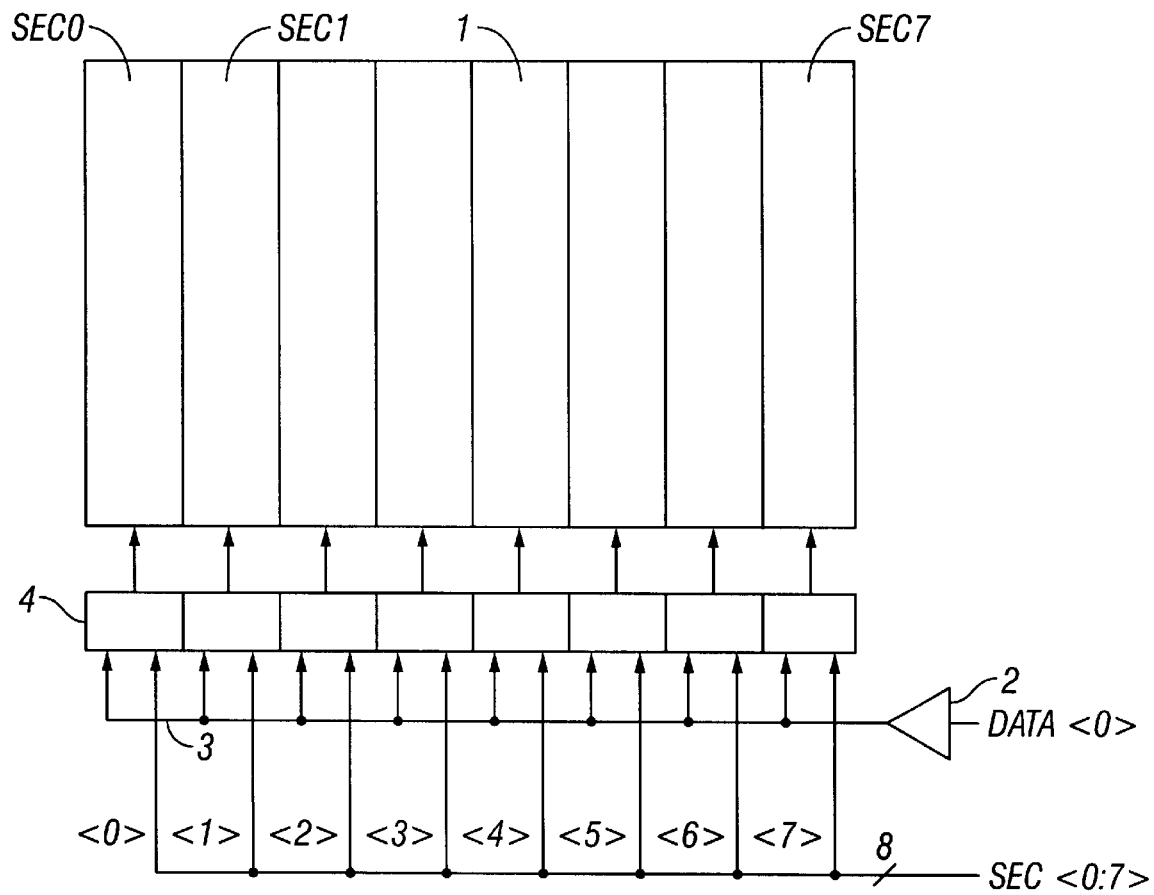
FIG. 14
*(PriorArt)*

BUFFER CIRCUIT, AND SEMICONDUCTOR DEVICE AND SEMICONDUCTOR MEMORY DEVICE INCLUDING SAME

CROSS REFERENCE TO RELATED APPLICATIONS

The subject application is related to subject matter disclosed in Japanese Patent Application No. H2000-65409 filed on Mar. 9, 2000 in Japan to which the subject application claims priority under Paris Convention and which is incorporated herein by reference.

BACKGROUND OF THE INVENTION

The present invention relates generally to a buffer circuit for selectively driving a plurality of gate circuits scattered in a semiconductor integrated circuit, and a semiconductor device and semiconductor memory device including the same.

When a plurality of gate electrodes scattered in a semiconductor chip are selectively driven by a single buffer circuit, the drivability of the buffer circuit is determined by a balance between the signal propagation delay and consumed current value in a path having the maximum signal propagation delay. That is, although the driving current for the buffer circuit must be increased in order to decrease the signal propagation delay, it is usually required to design the buffer circuit so that the operating frequency of the buffer circuit is not less than a target operating frequency and the consumed current value exceeds a specified value.

FIG. 14 is a schematic diagram of a conventional semiconductor memory device including a buffer circuit of this type.

A memory cell array 1 comprising memory cells (not shown) arranged in the form of an array is divided into eight sections SEC0 through SEC7. Input data DATA<0> to be written in the memory cells are transferred to a global data line 3 by means of a global write buffer 2. On the other hand, each of signals SEC<0:7> for selecting a section, in which data are to be written and which is obtained by decoding upper three bits of an address, is designed to activate one of local write buffers 4, each of which is provided for a corresponding one of the sections. Data transferred to the global data line 3 are written in the memory cell by means of a corresponding one of the local write buffers 4, which is activated by each of the signals SEC<0:7>. The driving amplitude of the global write buffer 2 for driving the global data line 3 is set so that the data propagation delay during the write of data in the farthest section SEC<0> is not less than a specific value corresponding to a write operating frequency.

By the way, since the global data line 3 driven by the global write buffer 2 is connected to the large number of local write buffers 4 and has a long signal line, its wiring resistance and wiring capacitance as well as the gate capacitance of MOS transistors have very large values. Therefore, in order to prevent the write operating frequency from lowering, the charging/discharging currents of loads must be set to be very large values, so that there is a problem in that it is not possible to avoid the increase of current consumption. This problem is not only caused particularly in semiconductor memory devices, but it is also caused in all of semiconductor devices which have large electrostatic capacity and large wiring resistance and in which gate circuits to be connected are scattered on signal lines. Particularly in recent years, with the improvement of operating frequencies and parallel processing degrees, the current consumption of semiconductor devices tends to increase, so that it is increasingly an important problem in future that how current consumption is reduced.

SUMMARY OF THE INVENTION

It is therefore an object of the present invention to eliminate the aforementioned problems and to provide a buffer circuit capable of reducing its current consumption while holding its operating frequency, and a semiconductor device and semiconductor memory device using the same.

According to a first aspect of the present invention, there is provided a buffer circuit comprising:

an input terminal to receive input data;

an output terminal to output a driving signal based on said input data to an output signal line which is connected to a plurality of gate circuits; and a driving amplitude changing circuit configured to change an amplitude of said driving signal in accordance with assignment of a specific gate circuit in said plurality of gate circuits.

According to a second aspect of the present invention, there is provided a semiconductor device comprising:

a first buffer circuit including an input terminal to receive input data, an output terminal to output a driving signal to an output signal line which is connected to a plurality of gates circuits, and a driving amplitude changing circuit configured to change an amplitude of said driving signal in accordance with assignment of a specific gate circuit in said plurality of gates;

a decoder circuit for decoding an address of said plurality of gate circuits to output a decoded signal for said plurality of gate circuits and a signal corresponding to the specific gate circuit for changing a driving amplitude to said first buffer circuit; and a second buffer circuit configured to supply said driving signal with changed amplitude from said first buffer circuit to said specific gate circuit in response to said decoded signal from said decoder circuit.

According to a third aspect of the present invention, there is provided a semiconductor memory device comprising:

a memory cell array including a plurality of memory cells which are arranged in the form of rows and columns and each of which is provided for storing data, a plurality of bit lines which connect said memory cells in column direction and which are provided for transferring write data to said memory cells, and a plurality of word lines which are arranged in row direction and which are provided for selecting said memory cell row;

a bit line selecting circuit configured to select said bit lines on the basis of an address;

a word line selecting circuit configured to select said word lines on the basis of an address;

a data line, connected to said bit lines via said bit line selecting circuit, for transferring write data; and a buffer circuit configured to drive said data line at an amplitude according to a position of a memory cell in which data are written.

According to the present invention, the buffer circuit is designed to change its driving amplitude in accordance with the driven gate circuit. Therefore, for example, when the signal line to the gate circuit is long, the driving amplitude is increased, and when it is short, the driving amplitude is decreased. In addition, when the gate circuit exists on a critical path, the driving amplitude is increased, and when it does not exist on the critical path, the driving amplitude is decreased. Thus, only when a path having a large signal propagation delay is driven, its driving amplitude is increased, so that it is possible to simultaneously achieve the reduction of current consumption and the improvement of the operating frequency.

According to the present invention, a buffer circuit is designed to change a driving amplitude to a data line in accordance with the position of a memory cell in which data are to be written. Therefore, when the position of the memory cell is far from the buffer circuit, the driving amplitude is increased, and when it is near to the buffer circuit, the driving amplitude is decreased, so that it is possible to achieve both of the reduction of current consumption and the improvement of the operating frequency while maintaining the operating frequency. Specifically, the buffer circuit changes its driving amplitude on the basis of, e.g., the position of a bit line and/or word line which are connected to a memory cell in which data are written. The positions of the bit lines and word lines can be distinguished by referring to at least part of an address or information obtained by decoding the address. Preferably, the buffer circuit drives the data line so that the difference between data rewriting times in memory cells connected to the same word line or the same bit line or in all of memory cells in the memory cell array is small. More preferably, memory cell arrays and buffer circuits are provided so as to make pairs, respectively, and the positions of memory cells in which data are written at the same timing are determined so that the driving amplitude of one of the buffer circuit increase when the driving amplitude of the other buffer circuit is small. Thus, the maximum value of current consumption can be suppressed.

BRIEF DESCRIPTION OF THE DRAWINGS

In the drawings:

FIG. 14 is a block diagram of a conventional semiconductor device.

DESCRIPTION OF THE PREFERRED EMBODIMENTS

Referring now to the accompanying drawings, the preferred embodiments of the present invention will be described below.

Figure 1:
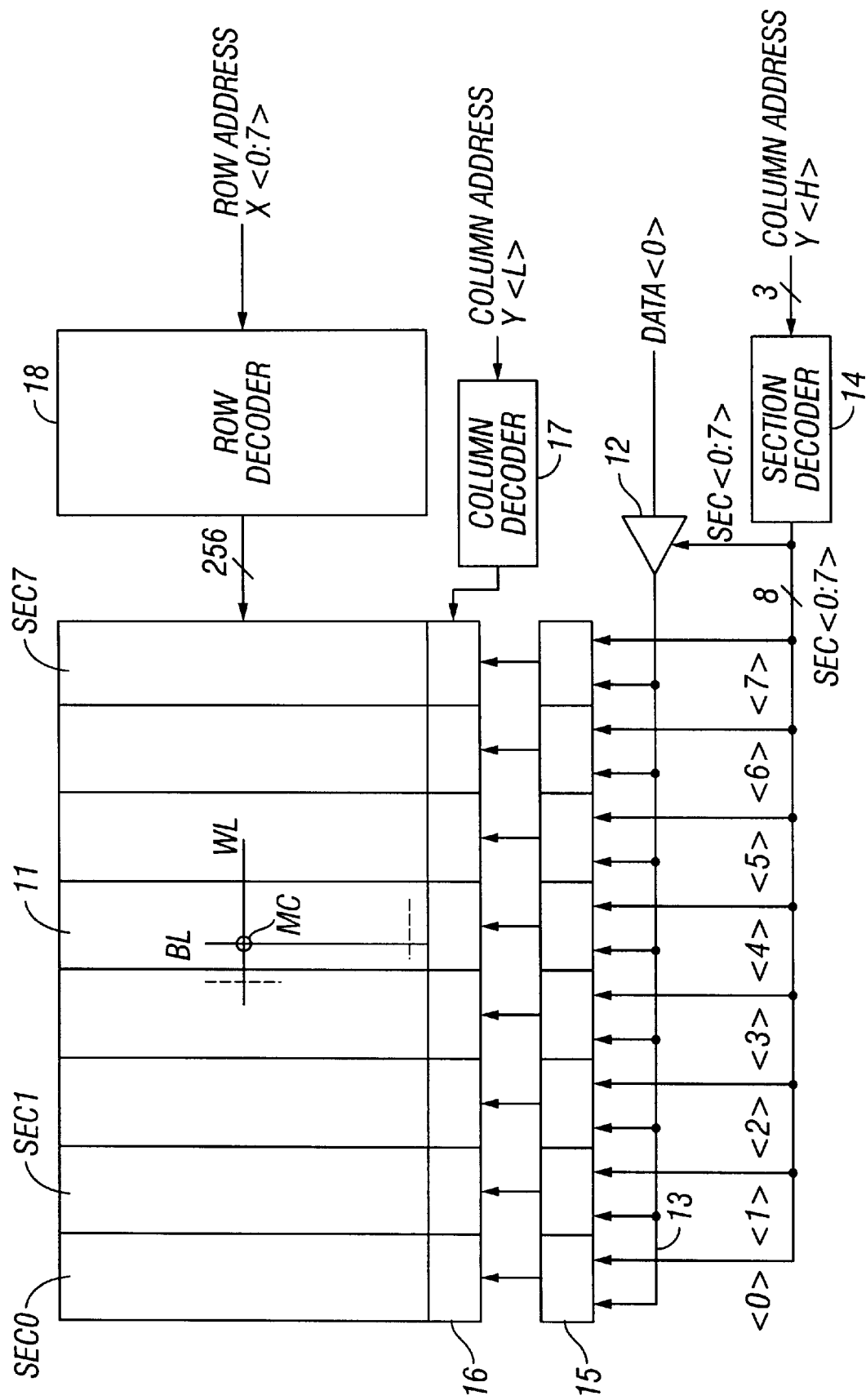
FIG. 1 is a block diagram of the first preferred embodiment of a semiconductor memory device according to the present invention.

FIG. 1 is a block diagram schematically showing the construction of the first preferred embodiment of a semiconductor memory device according to the present invention.

A memory cell array 11 includes: a plurality of memory cells MC, arranged in the form of an array, for storing data; a plurality of bit lines BL, connected to the memory cells MC, for transmitting data to be written to the memory cells MC; and a plurality of word line WL, arranged so as to be perpendicular to the bit lines BL, for selecting one of the memory cells MC. The memory cell array 11 is divided into eighth sections SEC0 through SEC7 in directions of the word lines WL. Input data DATA<0> to be written in the memory cells MC are transferred to a global data line 13 by means of a global write buffer 12. On the other hand, each of section selecting signals SEC<0:7> which is obtained by decoding upper three bits of a column address Y by means of a section decoder 14 is designed to activate one of local write buffers 15, each of which is arranged for a corresponding one of the sections. Data transferred to the global buffer line 13 are written in a corresponding one of the memory cells MC via a corresponding one of the bit lines BL, which is selected by a corresponding one of column gates 16, by means of a corresponding one of the local write buffers 15, which is activated by each of the section selecting signals SEC<0:7>. Each of the column gates 16 serving as bit line selecting circuits is also provided for a corresponding one of the sections SEC0 through SEC7. Each of the column gates 16 is designed to connect one (or one set) of the bit lines BL to a corresponding one of the local write buffers 15 by a gate selecting signal which is obtained by decoding lower bits of the column address Y by means of a column decoder 17. Each of row addresses X<0:7> is decoded by a row decoder 18 for selecting one of the word lines WL.

The global write buffer 12 inputs the section selecting signals SEC<0> and SEC<7> of the section selecting signals SEC<0:7> from the section decoder 14, for causing a driving amplitude during write in the section SEC0 of the memory cell 11 to be different from a driving amplitude during write in the section SEC7 of the memory cell 11.

Figure 2:
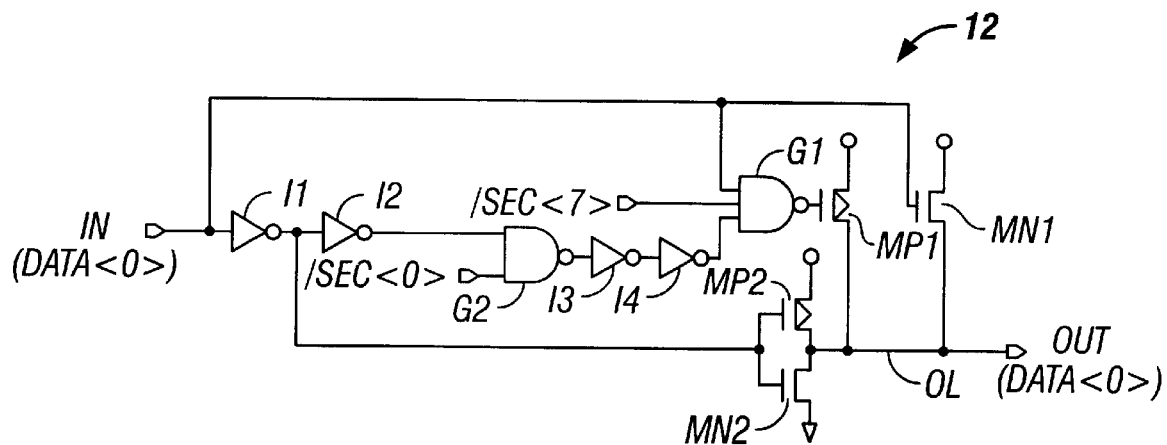
FIG. 2 is a circuit diagram showing an example of a global write buffer of the semiconductor memory device of FIG. 1.

FIG. 2 is a block diagram showing an example of the global write buffer 12. Input data DATA<0> are inputted from an IN terminal to be inputted to a CMOS inverter, which comprises a P-channel MOS transistor MP2 and an N-channel MOS transistor MN2, via an inverter I1. The output line OL of the CMOS inverter is communicated with the global data line 13. The output line OL is connected to an N-channel MOS transistor N1 for driving the output line OL on the basis of the input data DATA<0>, and a P-channel MOS transistor for supplemental-driving the output line OL. The gate of the P-channel MOS transistor MP1 is driven by the output of a three-input NAND gate G1. The three-input NAND gate G1 is designed to receive input data DATA<0> as a first input, an inverted section selecting signal /SEC<7> (/ denotes a negative logic which will be hereinafter the same) as a second input, and input data DATA<0>, which are delayed via the inverter I1, an inverter I2, a two-input NAND gate G2 and inverters I3 and I4, as a third input. The two-input NAND gate G2 is designed to receive the output of the inverter I2 as a first input, and an inverted section selecting signal /SEC<0> as a third input.

In the semiconductor memory device with this construction, when data are written in the farthest section SEC0 from the global write buffer 12, the section selecting signal SEC<0> has "H", and the section selecting signals SEC<L> through SEC<7> have "L". As a result, the output of the two-input NAND gate G2 is fixed so as to have "H", so that the three-input NAND gate G1 is an activated mode for passing the input data DATA<0>. Therefore, in this case, the output line OL is driven at a large driving amplitude using both of the transistors MP1 and NM1.

On the other hand, when data are written in the nearest section SEC7 to the global write buffer 12, the section selecting signals SEC<0> through SEC<6> have "L", and the section selecting signal SEC<7> has "H". As a result, the output of the three-input NAND gate G1 is fixed so as to have "H", so that the transistor MP1 is in an OFF state. Therefore, the output line OL is driven at a small driving amplitude using only the source-follower transistor MN1.

Moreover, when data are written in intermediate sections SEC1 through SEC6 by the global write buffer 12, both of the section selecting signals SEC<0> and SEC<7> have "L" level, so that both of the NAND gates G1 and G2 are activated. At this time, the input data DATA<0> are inputted directly to the NAND gate G1, and their inverted data are slightly delayed to be inputted to the NAND gate G1 via the inverters I1 and I2, the NAND gate G2 and the inverters I3 and I4, so that these gates constitute a one-shot pulse generating circuit. The one-shot pulse generating circuit is designed to use input data as a trigger to output a pulse having a pulse width corresponding to a propagation delay difference. As a result, the output line OL is driven by both of the transistors MP1 and MN1 by the above described pulse width, and thereafter, driven by only the transistor MN1.

Thus, according to the global write buffer 12, the driving amplitude for driving the data line 13 is large when data are written in the farthest section SEC0, small when data are written in the nearest section SEC7, and intermediate when data are written in other sections SEC1 through SEC6. Therefore, if these amplitudes are appropriately adjusted, it is possible to reduce current consumption during write without lowering the operating frequency.

Figure 3A:
FIGS. 3A through 3C are waveform illustrations showing the variation in output signal with respect to a predetermined input signal by a specific output of a section decoder in the global write buffer of FIG. 2.
Figure 3B:
Figure 3C:
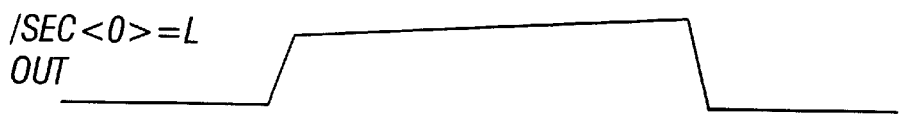

With respect to an input waveform IN shown in FIG. 3A, FIG. 3B shows an output waveform when the section selecting signal /SEC<7> has "L", and FIG. 3C shows an output waveform when the section selecting signal /SEC<0> has "L". It can be seen that the amplitude is small in the former and large in the latter.

Figure 4:
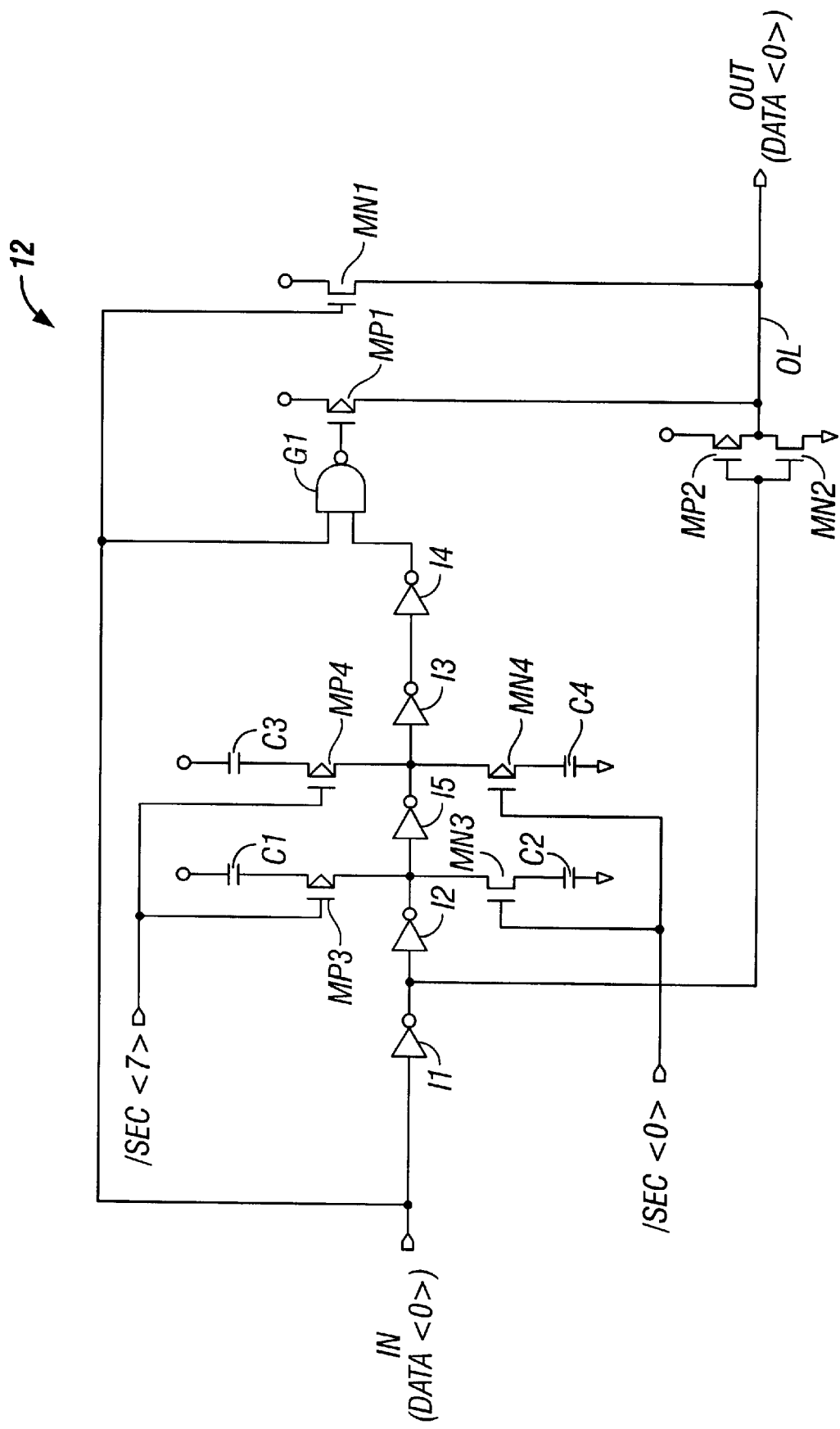
FIG. 4 is a circuit diagram showing another example of a global write buffer of the semiconductor memory device of FIG. 1.

FIG. 4 is a circuit diagram showing another example of the global write buffer 12.

In this example, an inverter I5 is provided between the inverters I2 and I3 in place of the two-input NAND gate G2 in the above described preferred embodiment. Between the input end of the inverter I5 and a power supply terminal, a series circuit comprising a P-channel MOS transistor MP3 and a capacitor C1 is provided. Between the input end of the inverter I5 and a ground terminal, a series circuit comprising an N-channel MOS transistor MN3 and a capacitor C2 is provided. Between the output end of the inverter I5 and the power supply terminal, a series circuit comprising a P-channel MOS transistor MP4 and a capacitor C3 is provided. Between the output end of the inverter I5 and the ground terminal, a series circuit comprising an N-channel MOS transistor MN4 and a capacitor C4 is provided. The section selection signal /SEC<7> is supplied to gates of the P-channel MOS transistors MP3 and MP4, and the section selection signal /SEC<0> is supplied to gates of the N-channel MOS transistors MN3 and MP4.

With this construction, when data are written in the farthest section SEC0 from the global write buffer 12, the section selecting signal SEC<0> has "H", and the section selecting signals SEC<1> through SEC<7> have "L", so that all of the transistors MP3, MN3, MP4 and MN4 are in an ON state. Thus, the signal propagation delay in the inverters I1 through I5 is maximum. Therefore, the pulse width of an output pulse from the one-shot pulse generating circuit comprising the inverters I1 through I5 and the NAND gate G1 is maximum.

When data are written in the nearest section SEC7 to the global write buffer 12, the section selecting signals SEC<0> through SEC<6> have "L", and the section selecting signal SEC<7> has "H", so that all of the transistors MP3, M3, MP4 and MN4 are in an OFF state. Thus, the capacitors C1 through C4 are connected to the input/output end of the inverter I5, so that the signal propagation delay in the inverters I1 through I5 is minimum. Therefore, the pulse width of an output pulse from the one-shot pulse generating circuit comprising the inverters I1 through I5 and the NAND gate G1 is minimum. These states are the same as those in FIG. 3.

When data are written in the intermediate sections SEC1 through SEC6 by the global write buffer 12, both of the section selecting signals SEC<0> and SEC<7> have "L" level, so that only the transistors MN3 and MN4 are in the ON state and only the capacitors C2 and C4 are connected to the input/output end of the inverter I5. Therefore, the pulse width of an output pulse from the one-shot pulse generating circuit comprising the inverters I1 through I5 and the NAND gate G1 has an intermediate value.

Thus, by changing the pulse width of the driving pulse for driving the transistor MP1 every section to be written, it is possible to reduce current consumption during write without lowering the operating frequency. While the section selecting signal obtained by decoding the column address Y by means of the section decoder 14 has been inputted to the global write buffer 12 to switch the driving amplitude, at least part of the column address Y before decoding may be inputted to switch the driving amplitude.

Figure 5:
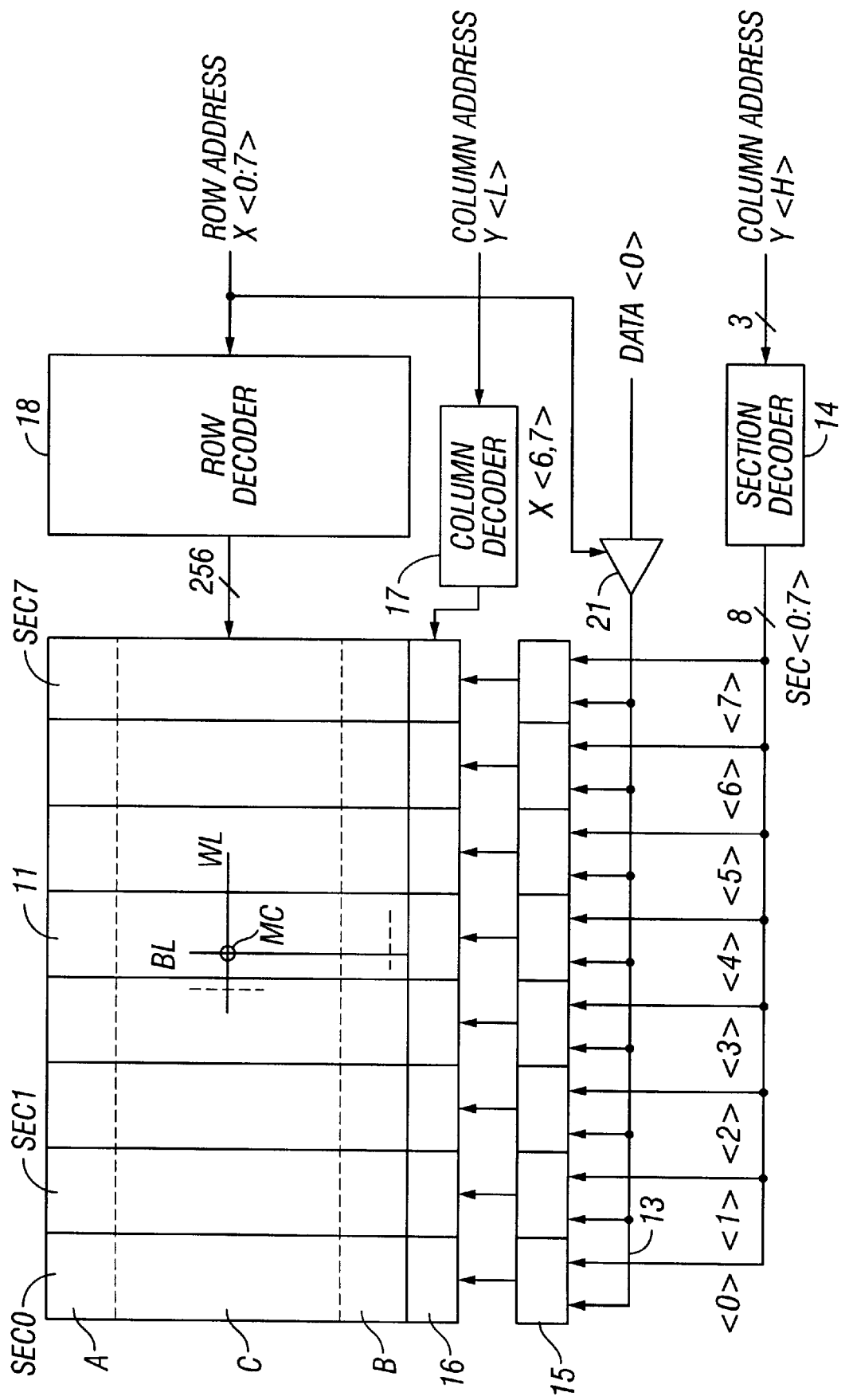
FIG. 5 is a block diagram of the second preferred embodiment of a semiconductor memory device according to the present invention.

FIG. 5 is a block diagram of the second preferred embodiment of a semiconductor memory device according to the present invention.

In the preceding preferred embodiment, the driving amplitude of the global write buffer 12 is switched by the position of a section in which data are written, i.e., the position of a bit line BL to which data are transferred. However, in this preferred embodiment, the driving amplitude of a global write buffer 21 is switched by the position of a selecting word line WL. In this preferred embodiment, addresses X<6> and X<7> of upper two bits of row addresses X<0:7> for selecting one of the word lines WL are inputted to the global write buffer 21. Other construction are the same as those in FIG. 1.

Figure 6:
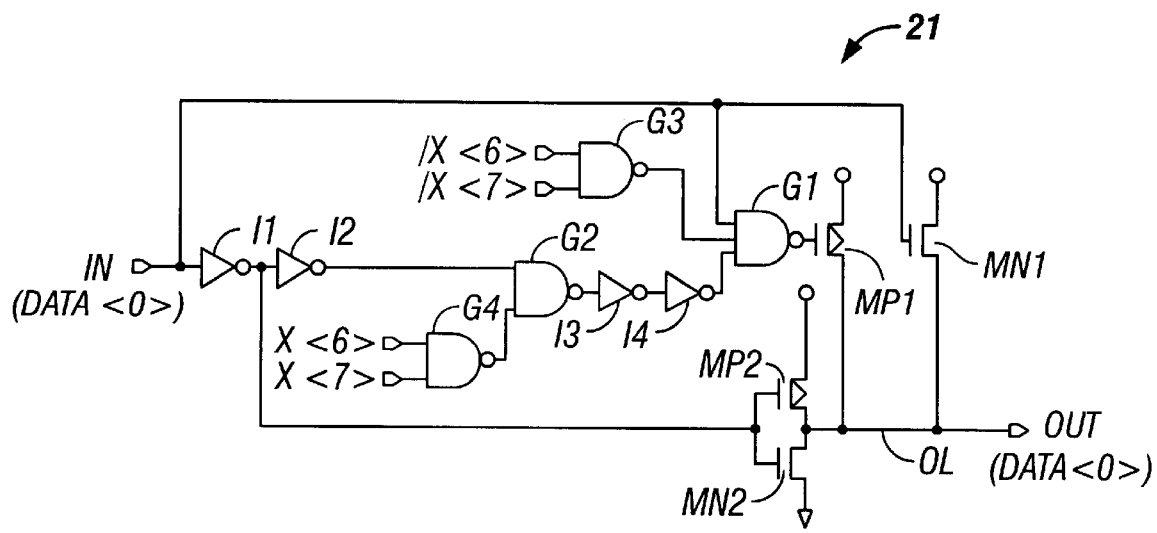
FIG. 6 is a circuit diagram showing an example of a global write buffer of the semiconductor memory device of FIG. 5.

The global write buffer 21 may be constructed as shown in, e.g., FIG. 6. This circuit is an modified circuit which is obtained by modifying the circuit of FIG. 2. In this circuit, the NAND outputs of addresses /X<6> and /X<7> due to a NAND gate G3 are given as the second input of a three-input NAND gate G1, and the NAND outputs of addresses X<6> and X<7> due to a NAND gate G4 are given as the second input of a two-input NAND gate G2.

According to this circuit, when both of the row addresses X<6> and X<7> have "H", i.e., when data are written in the top quarter region A of the memory cell array 11 in FIG. 4, both of the outputs of the NAND gate G3 and the inverter I4 are fixed so as to have "H", so that the output line OL is driven at a large driving amplitude using both of the transistors MP1 and MN1. When both of the row addresses X<6> and X<7> have "L", i.e., when data are written in the bottom quarter region B of the memory cell array 11 in FIG. 4, the output of the NAND gate G3 is fixed so as to have "L", and the output of the NAND gate G1 is fixed so as to have "H", so that the output line OL is driven at a small driving amplitude using only the transistor MN1. When any one of the row addresses X<6> and X<7> has "L", i.e., when data are written the central half region C of the memory cell array 11 in FIG. 4, both of the outputs of the NAND gates G3 and G4 are fixed so as to have "H", so that a one-shot pulse generating circuit is formed to allow the transistor MP1 to be in an intermediate mode for driving pulses. While the row address X inputted to the row decoder 18 has been inputted to the global write buffer 21 to switch the driving amplitude in this preferred embodiment, at least part of the output of the row decoder 18 may be inputted to switch the driving amplitude.

Figure 7A:
FIGS. 7A through 7C are waveform illustrations showing the variation in output signal with respect to a predetermined input signal by a specific output of a section decoder in the global write buffer of FIG. 6.
Figure 7B:
Figure 7C:

The operation of this global buffer is shown in FIGS. 7A through 7C. With respect to an input waveform IN shown in FIG. 7A, FIG. 7B shows an output waveform when both of the addresses /X<6> and /X<7> have "H", and FIG. 7C shows an output waveform when both of addresses X<6> and X<7> have "H". It can be seen that the amplitude is small in the former and large in the latter.

Figure 8:
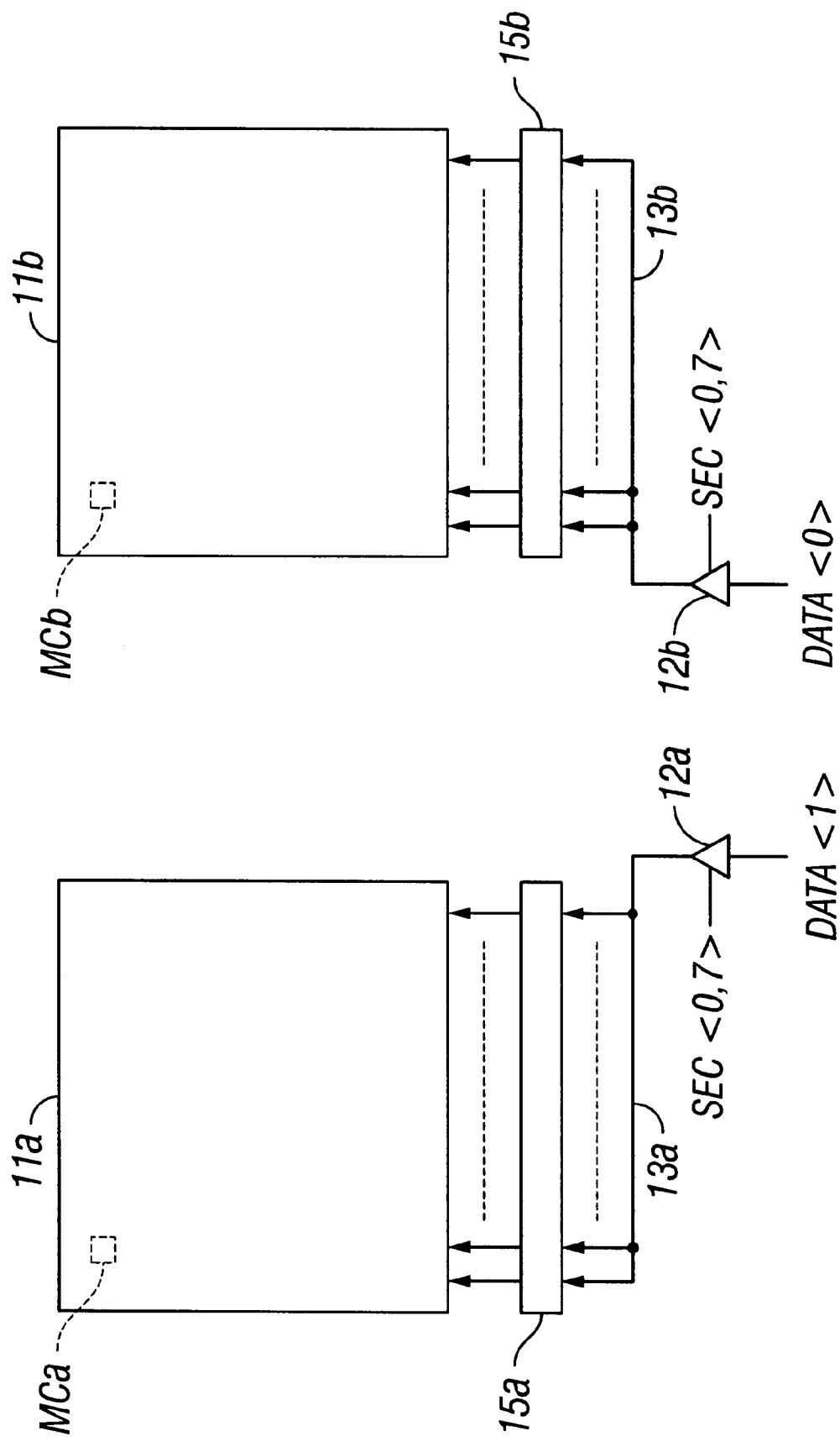
FIG. 8 is a block diagram of the third preferred embodiment of a semiconductor memory device according to the present invention.

FIG. 8 is a block diagram showing the third preferred embodiment of the present invention.

In this preferred embodiment, memory cell arrays 11a and 11b, global write buffers 12a and 12b, global data lines 13a and 13b, and local write buffers 15a and 15b are provided so as to make pairs, respectively. The global write buffers 12a and 12b are arranged between the memory cell arrays 11a and 11b, and memory cells MCA and MCB, in which data are simultaneously written, are arranged in the memory cell arrays 11a and 11b at corresponding positions, so that the driving amplitude of one buffer 12b can be decreased when the driving amplitude of the other buffer 12a is increased. Thus, it is possible to suppress the maximum value of the consumed current value, and it is also possible to suppress the variation in power supply voltage.

Figure 9:
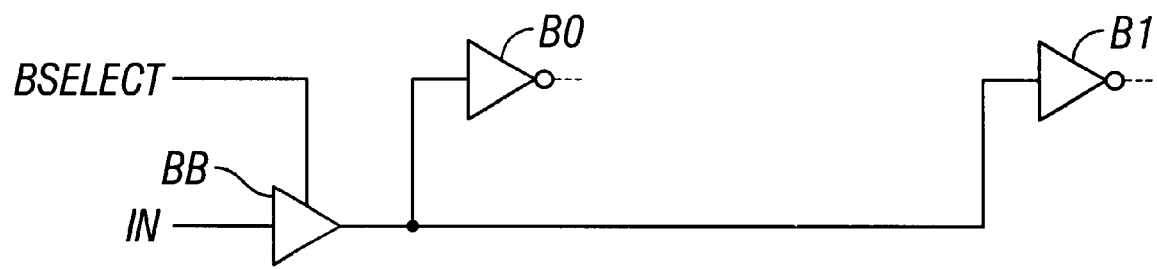
FIG. 9 is a block diagram of the fourth preferred embodiment of a semiconductor device according to the present invention.

FIG. 9 shows the fourth preferred embodiment of a semiconductor device according to the present invention, wherein usual gate circuits are scattered in the chip.

Figure 10:
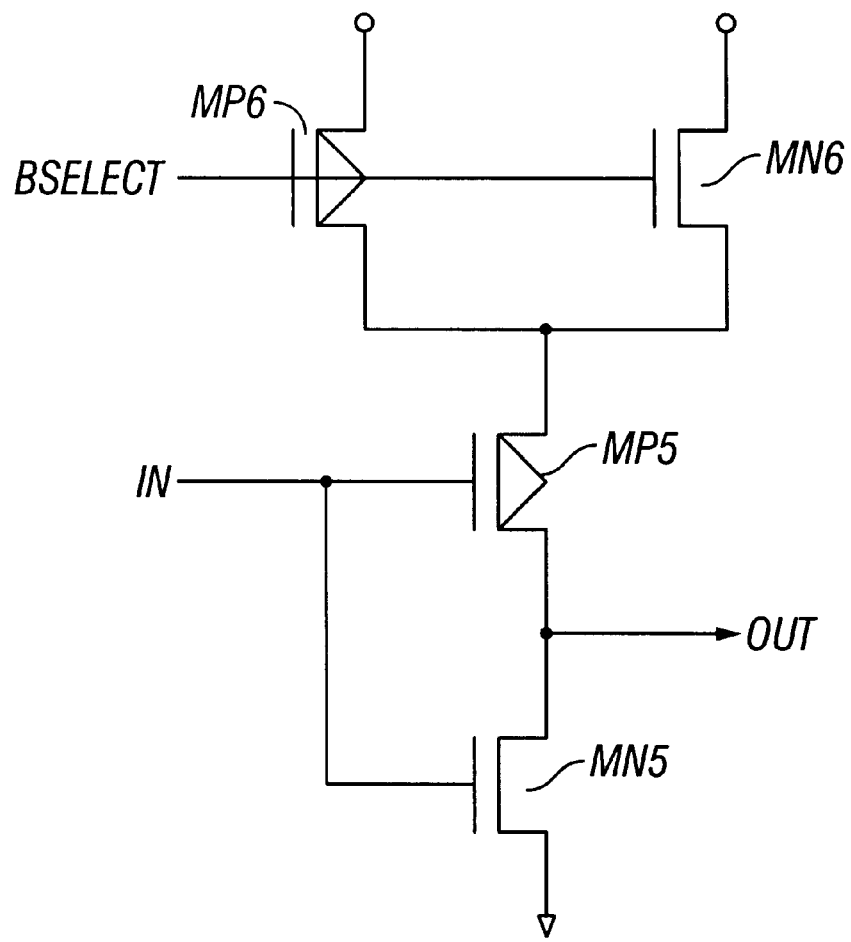
FIG. 10 is a circuit diagram showing an example of a buffer of the semiconductor device of FIG. 9.
Figure 11A:
FIGS. 11A through 11C are waveform illustrations showing the variation in output signal with respect to a predetermined input signal by a selecting signal in the buffer of FIG. 10.
Figure 11B:
Figure 11C:
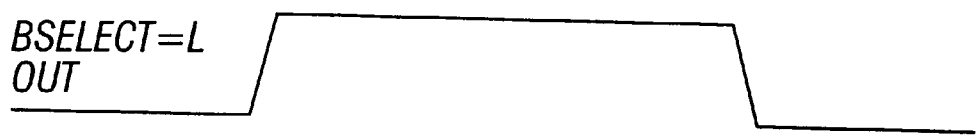

A buffer BB for driving inverters B0 and B1 is designed to change its driving amplitude by a selecting signal BSELECT. That is, the driving amplitude is decreased when the inverter B0 nearer to the buffer BB is driven, and the driving amplitude is increased when the inverter B1 farther from the buffer BB is driven. As an example of the buffer BB, a circuit shown in FIG. 10 may be used. On the side of a power supply for a CMOS inverter comprising a P-channel MOS transistor NP5 and an N-channel MOS transistor NM5 for buffering an input signal IN, a parallel circuit comprising a P-channel MOS transistor MP6 and an N-channel MOS transistor MN6 which acts as a source-follower is provided. When the selecting signal BSELECT has "H", the transistor MP6 is turned ON and the transistor MN6 is turned OFF, so that the CMOS inverter is driven at a small amplitude. On the other hand, when the selecting signal BSELECT has "L", the transistor MP6 is turned ON and the transistor MN6 is turned OFF, so that the CMOS inverter is driven at a large amplitude. This state is shown in FIGS. 11A through 11C.

In this preferred embodiment, since the inverter B0 exists nearer to the buffer BB than the inverter B1, even if the driving amplitude is decreased, if an appropriate amplitude is selected, the signal propagation delay can be equal to that of the inverter B1.

Figure 12:
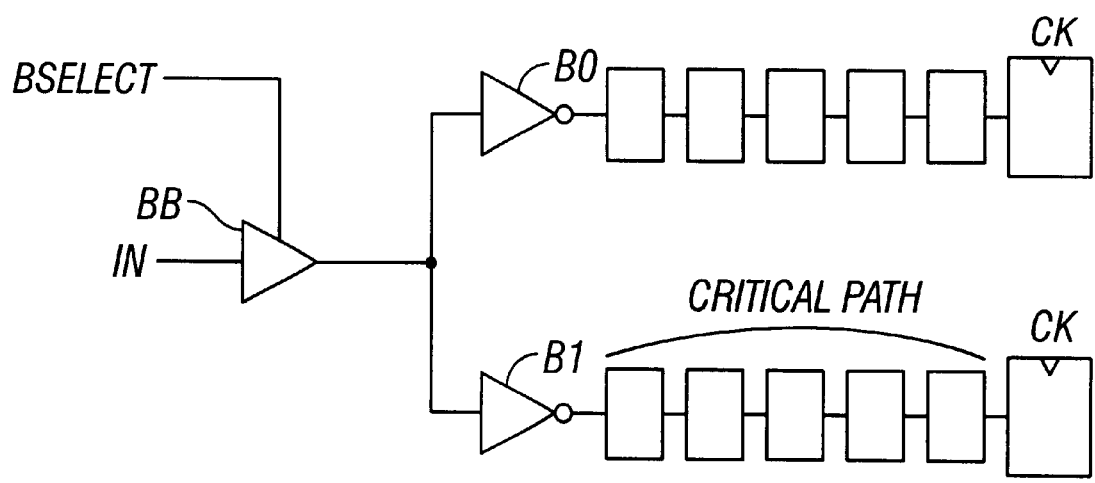
FIG. 12 is a block diagram of the fifth preferred embodiment of a semiconductor device according to the present invention.

FIG. 12 shows the fifth preferred embodiment of the present invention.

In this preferred embodiment, it is supposed that a path connected to an inverter B1 is a critical path, i.e., a path for defining a cycle time, and a path connected to an inverter B0 is not a critical path. A buffer BB is the same as that shown in FIG. 10. In this circuit, when the side of the inverter B0 is driven, a selecting signal BSELECT is set so as to have "H", to drive the inverter at a small amplitude, and when the side of the inverter B0 is driven, the selecting signal BSELECT is set so as to have "L" to drive the inverter at a large amplitude. Thus, since the driving amplitude can be suppressed when a gate circuit which does not exist in the critical path is driven, it is possible to reduce electric power consumption without deteriorating the cycle time.

Figure 13:
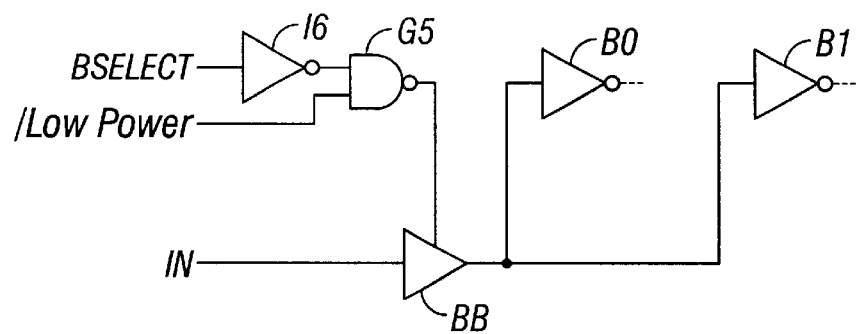
FIG. 13 is a block diagram of the sixth preferred embodiment of a semiconductor device according to the present invention.

FIG. 13 shows the sixth preferred embodiment of the present invention.

In this preferred embodiment, when a semiconductor device has a low electric power consumption mode, the device is driven at a small amplitude in the low electric power consumption mode regardless of a driven gate circuit. That is, a selecting signal BSELECT is inputted to a two-input NAND gate G5 via an inverter I6. On the other hand, a low electric power consumption mode signal /LowPower, which has "H" in a usual mode and "L" in the low electric power consumption mode, is given as the other input of the two-input NAND gate G5. Thus, when the low electric power consumption mode signal /LowPower has "L", the output of the gate G5 always has "H" regardless of the value of the selecting signal BSELECT, so that the device is in a small-amplitude driving mode. Thus, it is possible to reduce electric power consumption.

According to the present invention, the buffer circuit is designed to change its driving amplitude in accordance with the driven gate circuit. Therefore, for example, when the signal line to the gate circuit is long, the driving amplitude is increased, and when it is short, the driving amplitude is decreased. In addition, when the gate circuit exists on the critical path, the driving amplitude is increased, and when it does not exist on the critical path, the driving amplitude is decreased. Thus, only when a gate circuit having a large signal propagation delay is driven, its driving amplitude is increased, so that it is possible to simultaneously achieve the reduction of current consumption and the improvement of the operating frequency.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A buffer circuit comprising:
    an input terminal to receive input data;
    an output terminal to output a driving signal based on said input data to an output signal line which is connected to a plurality of gate circuits arranged in line; and
    a driving amplitude changing circuit configured to change an amplitude of said driving signal in response to a signal to designate a specific gate circuit in said plurality of gate circuits.

2. The buffer circuit as set forth in claim 1, wherein said driving amplitude changing circuit has a logic circuit, the logical state of which changes when a signal for assigning the specific gate circuit is inputted, for changing a driving amplitude.

3. The buffer circuit as set forth in claim 2, wherein said logic circuit increases the driving amplitude when the signal line to said specific gate circuit is long, and decrease the driving amplitude when the signal line to said specific gate circuit is short.

4. The buffer circuit as set forth in claim 2, wherein said logic circuit increases the driving amplitude when said specific gate circuit exists on a critical path, and decrease the driving amplitude when said specific gate circuit does not exist on a critical path.

5. A semiconductor device comprising:
    a first buffer circuit including an input terminal to receive input data, an output terminal to output a driving signal to an output signal line which is connected to a plurality of gate circuits arranged in line, and a driving amplitude changing circuit configured to change an amplitude of said driving signal in response to a signal to designate a specifc gate circuit of said plurality of gate circuits;
    a decoder circuit for decoding an address of said plurality of gate circuits to output a decoded signal for said plurality of gate circuits and a signal corresponding to the specific gate circuit for changing a driving amplitude to said first buffer circuit; and
    a second buffer circuit configured to supply said driving signal with changed amplitude from said fiat buffer circuit to said specific gate circuit in response to said decoded signal from said decoder circuit.

6. The semiconductor circuit as set forth in claim 5, wherein said driving amplitude changing circuit has a logic circuit, the logical state of which changes when the signal for assigning a specific gate circuit is inputted, for changing the driving amplitude.

7. The semiconductor circuit as set forth in claim 5, wherein said logic circuit increases the driving amplitude when the signal line to said specific gate circuit is long, and decrease the driving amplitude when the signal line to said specific gate circuit is short.

8. The semiconductor circuit as set forth in claim 5, wherein said logic circuit increases the driving amplitude when said specific circuit exists on a critical path, and decrease the driving amplitude when said specific gate circuit does not exist on a critical path.

9. The semiconductor device as set forth in claim 5, which further comprises a power saving circuit for decreasing its driving amplitude when a transfer command to a low electric power consumption mode is detected.

10. The semiconductor device as set forth in claim 5, wherein said driving amplitude changing circuit changes its driving amplitude of the input data by changing a current supply time to said gate circuit.

11. The semiconductor device as set forth in claim 5, wherein said first buffer circuit further comprises a one-shot pulse generating circuit using an edge of an input signal as a trigger, and said driving amplitude changing circuit changes said current supply time to said gate circuit to change the driving amplitude for a case where it is activated in the whole period of time in which said input signal is inputted and a case where it is activated in part of the whole period of time in which said input signal is inputted, by the output of said one-shot pulse generating circuit.

12. The semiconductor device as set forth in claim 5, wherein said first buffer circuit has a source-follower circuit for driving an output line in accordance with an input signal, and wherein said source-follower circuit mainly drives said output line when a driving amplitude is suppressed.

13. A semiconductor memory device comprising:
    a memory cell array including a plurality of memory cells which are arranged in the form of rows and columns and each of which is provided for storing data, a plurality of bit lines which connect said memory cells in column direction and which are provided for transferring write data to said memory cells, and a plurality of word lines which are arranged in row direction and which are provided for selecting said memory cell row;
    a bit line selecting circuit configured to select said bit lines on the basis of an address;
    a word line selecting circuit configured to select said word lines on the basis of an address;
    a data line, connected to said bit lines via said bit line selecting circuit, for transferring write data to be written in a memory cell; and
    a buffer circuit configured to drive said data line at an amplitude responsive to a position of a memory cell in which said write data are written.

14. The semiconductor memory device as set forth in claim 13, wherein said buffer circuit has a driving amplitude changing circuit for changing a driving amplitude on the basis of a position at which said bit line is connected to a memory cell in which data are to be written.

15. The semiconductor memory device as set forth in claim 13, wherein said buffer circuit has a driving amplitude changing circuit for increasing a driving amplitude when the distance between said buffer circuit and a bit line selecting circuit for connecting said data line to said bit line, to which a memory cell in which data are to be written is connected, is long, and for decreasing a driving amplitude when said distance is short.

16. The semiconductor memory device as set forth in claim 13, wherein said buffer circuit has a driving amplitude changing circuit for changing a driving amplitude on the basis of a position at which said word line is connected to a memory cell in which data are to be written.

17. The semiconductor memory device as set forth in claim 13, wherein said buffer circuit has a driving amplitude changing circuit for increasing a driving amplitude when the distance between said data line and said word line, to which a memory cell in which data are to be written is connected, is long, and for decreasing a driving amplitude when said distance is short.

18. The semiconductor memory device as set forth in claim 13, wherein said buffer circuit has a driving amplitude changing circuit for inputting at least part of information of an address to changing a driving amplitude on the basis of said information.

19. The semiconductor memory device as set forth in claim 13, wherein said buffer circuit has a driving amplitude changing circuit for inputting at least part of information, which is obtained by decoding an address, to change a driving amplitude on the basis of said information.

20. The semiconductor memory device as set forth in claim 13, wherein said buffer circuit has a driving amplitude changing circuit for changing its driving amplitude by changing a current supply time to said data line.

21. The semiconductor memory device as set forth in claim 13, wherein said buffer circuit further comprises a one-shot pulse generating circuit using an edge of input data as a trigger, and which changes a current supply time to said gate circuit to change a driving amplitude between a case where it is activated in the whole period of time in which said input data are inputted and a case where it is activated in part of the whole period of time in which said input data are inputted, by the output of said one-shot pulse generating circuit.

22. The semiconductor memory device as set forth in claim 13, wherein said first buffer circuit has a source-follower circuit for driving said data line in accordance with input data, and wherein said source-follower circuit mainly drives said data line when a driving amplitude is suppressed.

23. The semiconductor memory device as set forth in claim 13, wherein said buffer circuit has a driving amplitude changing circuit for driving said data line so as to decrease the difference between data rewriting times in memory cells connected to the same word line.

24. The semiconductor memory device as set forth in claim 13, wherein said buffer circuit has a driving amplitude changing circuit for driving said data line so as to decrease the difference between data rewriting times in memory cells connected to the same bit line.

25. The semiconductor memory device as set forth in claim 13, wherein said buffer circuit has a driving amplitude changing circuit for driving said data line so as to decrease the difference between data rewriting times in all of memory cells in said memory array.

26. The semiconductor memory device as set forth in claim 13, which further comprises another memory cell array provided so as to be a companion to said memory cell array, and another buffer circuit provided so as to be a companion to said buffer circuit, and wherein the positions of memory cells, in which data are written at the same timing, are determined so as to increase the driving amplitude of one of said buffer circuits when the driving amplitude of the other buffer circuit is small.

* * * * *